United States Patent [19]

Loebner et al.

[11] 4,284,467

[45] Aug. 18, 1981

[54] METHOD FOR MAKING SEMICONDUCTOR MATERIAL

[75] Inventors: Egon E. Loebner, Palo Alto; Paul E. Greene, Mountain View, both of Calif.

[73] Assignee: Hewlett-Packard Company, Palo Alto, Calif.

[21] Appl. No.: 631,576

[22] Filed: Nov. 13, 1975

Related U.S. Application Data

[63] Continuation of Ser. No. 226,351, Feb. 14, 1972, abandoned, which is a continuation of Ser. No. 832,276, Jun. 11, 1969, abandoned.

[51] Int. Cl.² ............................................. B01J 17/26
[52] U.S. Cl. ............................ 156/613; 156/DIG. 70; 252/301.4 R
[58] Field of Search .............. 156/610, 612, 613, 614, 156/621, 622, 624, DIG. 70, 600; 252/301.4 R

[56] References Cited

U.S. PATENT DOCUMENTS

| | | | |
|---|---|---|---|
| 3,146,137 | 8/1964 | Williams | 156/614 |
| 3,218,205 | 11/1965 | Ruehrwein | 156/614 |
| 3,224,913 | 12/1965 | Ruehrwein | 156/611 |
| 3,309,553 | 3/1967 | Kroener | 156/DIG. 70 |
| 3,312,570 | 4/1967 | Ruehrwein | 156/614 |
| 3,364,084 | 1/1968 | Ruehrwein | 156/614 |
| 3,441,453 | 4/1969 | Conrad | 156/DIG. 70 |
| 3,493,811 | 2/1970 | Ewing | 148/175 |

*Primary Examiner*—Hiram H. Bernstein
*Attorney, Agent, or Firm*—Ronald E. Grubman

[57] ABSTRACT

Useful semiconductor materials in which a p-n junction may be formed are made from compositions of the quaternary $Ga_yIn_{1-y}As_{1-x}P_x$ compound alloy system having values of x and y greater than 0.005 and less than 0.995 or having a value of x equal to 1.0 and a value of y from 0.45 to 0.80. In making these semiconductor materials a layer of selected composition of this compound alloy system is epitaxially grown on a substrate having a lattice constant substantially equal to that of the selected composition by substantially following an isolattice constant contour to the region of selected composition in the alloy system. Injection electroluminescent diodes are fabricated from these semiconductor materials by forming a p-n junction in the layer of selected composition and by forming electrical terminals in contact with the substrate and the layer of selected composition on opposite sides of the p-n junction.

7 Claims, 10 Drawing Figures

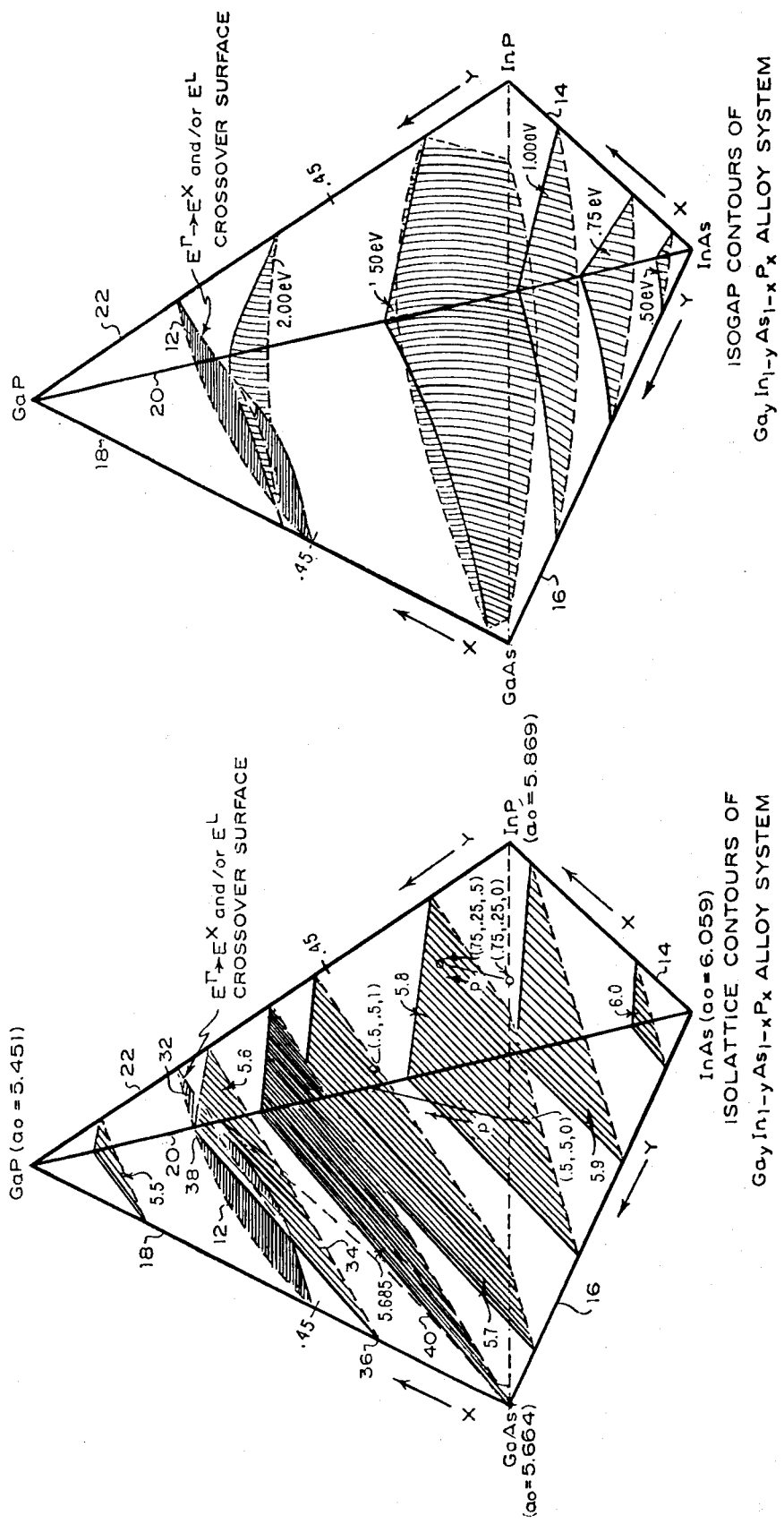

METHOD FOR MAKING SEMICONDUCTOR MATERIAL

This is a continuation of application Ser. No. 226,351, filed Feb. 14, 1972, and now abandoned, which is a continuation of application Ser. No. 832,276, filed June 11, 1969, and now abandoned.

BACKGROUND AND SUMMARY OF THE INVENTION

This invention generally relates to III–V compound alloy semiconductor materials and devices and, more particularly, to such of those materials and devices as may be used for producing visible injection electroluminescence. This invention further relates to an improved method for use in producing compound alloy semiconductor materials and devices with a substantially reduced lattice constant mismatch.

At present the best known and most highly luminous near edge emission semiconductor materials and devices are made from the ternary $GaAs_{1-x}P_x$ compound alloy system. Near edge emission is herein defined to include the emission resulting from radiative recombinations of electrons and holes across the energy band gap of the semiconductor material as well as radiative recombinations of electrons and holes originating and/or terminating on shallow defect states. The relative internal quantum efficiency $\eta_{q,\,int}$ of the $GaAs_{1-x}P_x$ compound alloy system as normalized to $\eta_{q,\,int}$ of GaAs (hereinafter referred to as the normalized internal quantum efficiency), the photopic luminosity $\bar{y}_{10,\lambda}$ as normalized to its maximum value (hereinafter referred to as the normalized photopic luminosity), and their product $\eta_\phi$ (hereinafter referred to as the normalized luminous efficiency) are plotted in FIG. 1 as functions of composition, energy band gap, and wavelength of emitted light. Both $\eta_{q,\,int}$ and $\eta_\phi$ are plotted for three ratios (1, 10 and 100) of the electron recombination lifetime $\tau^X$ of excess carriers within the indirect conduction band minima to the electron recombination lifetime $\tau^\Gamma$ of excess carriers within the direct conduction band minimum. This ratio is hereinafter referred to as the recombination lifetime ratio. It increases with the crystalline purity and perfection of the compound alloy system and conventionally ranges in value from 1 to 10, although values as high as 100 may be possible in the near future. See U.S. Pat. No. 3,398,310 issued to Larsen et al on Aug. 20, 1968.

As indicated in FIG. 1, the normalized internal quantum efficiency $\eta_{q,\,int}$ of the ternary $GaAs_{1-x}P_x$ compound alloy system begins to decrease appreciably with increasing values of x at wavelengths ranging from about 7500 to 6600 Å as the recombination lifetime ratio increases. These wavelengths are substantially longer than the wavelength of maximum photopic luminosity to the human eye (about 5500 Å). Thus, it may be seen that for the recombination lifetime ratios 1, 10 and 100, normalized luminous efficiencies $\eta_\phi$ greater than 0.01 can only be obtained over a limited spectral range including wavelengths of about 6000 to 5700 Å. Since the recombination lifetime ratio of the $GaAs_{1-x}P_x$ compound alloy system currently ranges between 1 and 10, it may be seen that the highest normalized luminous efficiency $\eta_\phi$ presently is no greater than about 0.08 and is obtained from a direct composition (herein defined as a composition below the direct-to-indirect crossover point) at a wavelength of about 6500 Å. As indicated for the recombination lifetime ratio 100, a normalized luminous efficiency $\eta_\phi$ as high as 0.2 may be obtained in the future from an indirect composition (herein defined as a composition above the direct-to-indirect crossover point) at a wavelength of about 6250 Å. Moreover, a higher normalized luminous efficiency $\eta_\phi$ can currently be obtained at a wavelength as short as 6000 Å from some indirect compositions having a recombination lifetime ratio greater than 1 (for example, 10) than can be obtained at a longer wavelength from any direct composition having a recombination lifetime ratio about an order of magnitude smaller (for example, 1). This high performance from indirect compositions of the $GaAs_{1-x}P_x$ compound alloy system may be explained primarily on the basis of two factors, as set forth in greater detail in U.S. Pat. No. 3,398,310 mentioned above. First, the indirect compositions have greater energy band gaps than have the direct compositions of this compound alloy system. Secondly, the efficient, radiative direct recombination mechanism begins to successfully compete with the inefficient, nonradiative indirect recombination mechanism in indirect compositions near the direct-to-indirect crossover point (hereinafter referred to simply as the crossover point) as the crystalline purity and perfection of the system is improved enough to make the recombination lifetime ratio greater than unity. However, it is still presently estimated that even in the future electroluminescent semiconductor materials and devices fabricated from the $GaAs_{1-x}P_x$ compound alloy system will only be capable of emitting red or orange light at a luminous efficiency no greater than 0.2 lumens per ampere.

Accordingly, the principal object of this invention is to provide improved near edge luminescing semiconductor materials and devices capable of emitting yellow and green light at a higher luminous efficiency, than can be obtained from the conventional ternary $GaAs_{1-x}P_x$ compound alloy system.

Another more general object of this invention is to provide an improved semiconductor material that may be used for making transistors, Schottky-barrier diodes, optical modulators and detectors, injection electroluminescent light sources, photodetectors and other such devices.

Semiconductor materials and devices are commonly fabricated from the ternary $GaAs_{1-x}P_x$ compound alloy system by epitaxially growing a layer of a selected composition near or at the crossover point of the system on a GaAs substrate. The lattice constant mismatch between GaAs and the crossover composition of the $GaAs_{1-x}P_x$ compound alloy system is about 1.62 percent. This lattice constant mismatch in combination with the composition gradient produced during growth of the epitaxial layer of selected composition causes dislocations at the interface between the substrate and the epitaxial layer. For a lattice constant mismatch as large as 1.62 percent there is a strong probability that some of these dislocations will propagate into the epitaxial layer. Dislocations in the epitaxial layer give rise to recombination centers that compete with those of the desired near edge emission. They also cause p-n junctions subsequently diffused into the epitaxial layer to have a ragged diffusion front. These factors degrade the injection and luminous efficiency of the resultant semiconductor materials and devices.

Accordingly, still another object of this invention is to provide a method for epitaxially growing a semiconductor compound alloy on a substrate with a substantially reduced lattice constant mismatch between the substrate and the epitaxially grown compound alloy so as to minimize the dislocations produced at the interface between the substrate and the compound alloy.

These objects are accomplished according to the preferred embodiments of this invention by epitaxially growing a selected composition of the quaternary $Ga_yIn_{1-y}As_{1-x}P_x$ compound alloy system with values of x and y greater than 0.005 and less than 0.995 or a value of x equal to 1.0 and a value of y from 0.45 to 0.80 on a substrate having a lattice constant substantially equal to the lattice constant of the selected composition of the system. The selected composition of the system is grown by substantially following an isolattice constant contour of the system to the region of selected composition so that a layer of graded composition is formed upon the substrate and a uniform layer of the selected composition is formed upon the layer of graded composition. An injection electroluminescent diode having a high luminous efficiency may be fabricated from the resultant semiconductor material by diffusing a p-n junction into the uniform layer of selected composition and by forming electrical terminals in contact with the substrate and the uniform layer of selected composition on opposite sides of the p-n junction.

DESCRIPTION OF THE DRAWINGS

FIG. 2 is a three dimensional representation of the quaternary $Ga_yIn_{1-y}As_{1-x}P_x$ compound alloy system showing some of the isoband gap contours of the system and their relationship to the crossover surface of the system. A third dimension parameter p is used to represent the frequency of the four possible types of bonds, namely Ga-As, Ga-P, In-As, and In-P, by the formula:

$$p = \frac{\text{number of Ga-P and In-As bonds}}{\text{number of Ga-As, Ga-P, In-As and In-P bonds}}.$$

The use of this third dimension parameter p is important to discriminate between quaternary compound alloys having identical chemical compositions but different ratios of these four possible types of bonds and, hence, different physical parameters such as $E^\Gamma$, $E^X$, and $E_L$. For example, quaternary compositions having values of x and y equal to 0.5 theoretically may be formed with values of p ranging from 0.0 for the bond structure $(Ga-As)_{0.5}(In-P)_{0.5}$ to 1.0 for the bond structure $(Ga-P)_{0.5}(In-As)_{0.5}$. This is indicated by the line extending between the x, y and p coordinates (0.5, 0.5, 0) and (0.5, 0.5, 1). As another illustration, quaternary compositions having a value of x equal to 0.75 and a value of y equal to 0.25 may be formed with values of p ranging from 0.0 for the bond structure $(Ga-As)_{0.25}(In-P)_{0.75}$ to 0.5 for the bond structure $(Ga-P)_{0.25}(In-As)_{0.25}(In-P)_{0.5}$. This is indicated by the line extending between the x, y and p coordinates (0.75, 0.25, 0) and (0.75, 0.25, 0.5). Although not all theoretically possible values of p may occur, a significant variation does occur for different methods of non-equilibrium growth.

Figure 3:
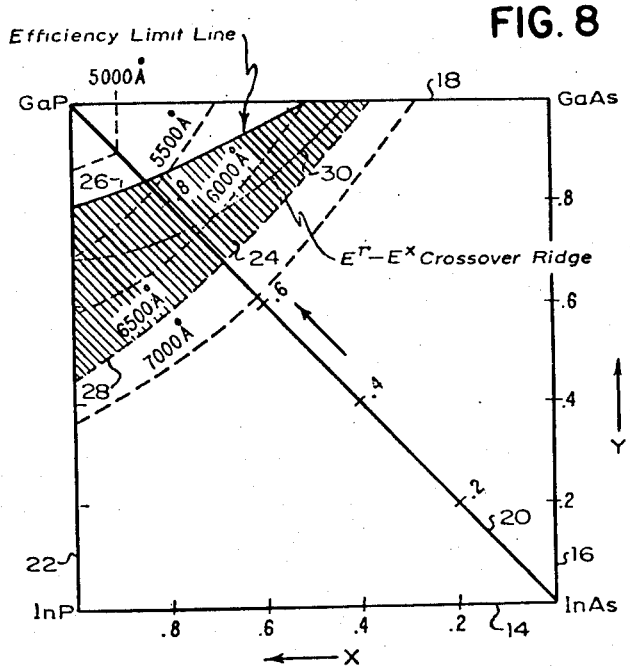

FIG. 3 is a two dimensional representation of the quaternary $Ga_yIn_{1-y}As_{1-x}P_x$ compound alloy system showing the optimum compositions for high luminous efficiency.

Figure 4:
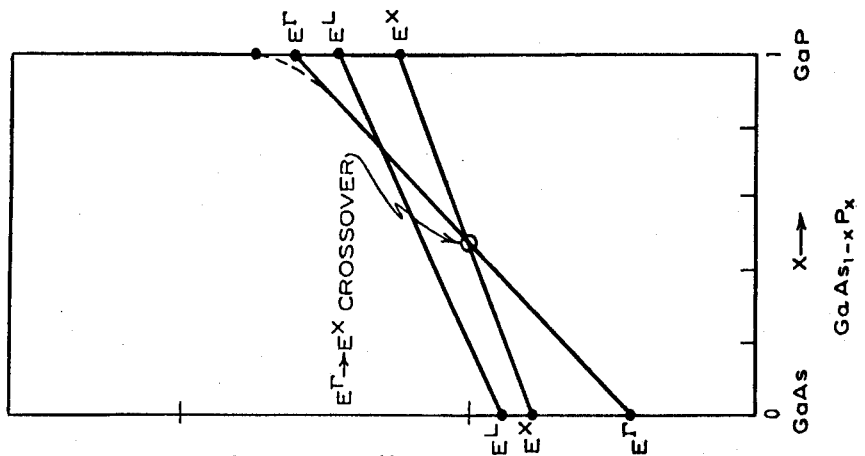
Figure 5:
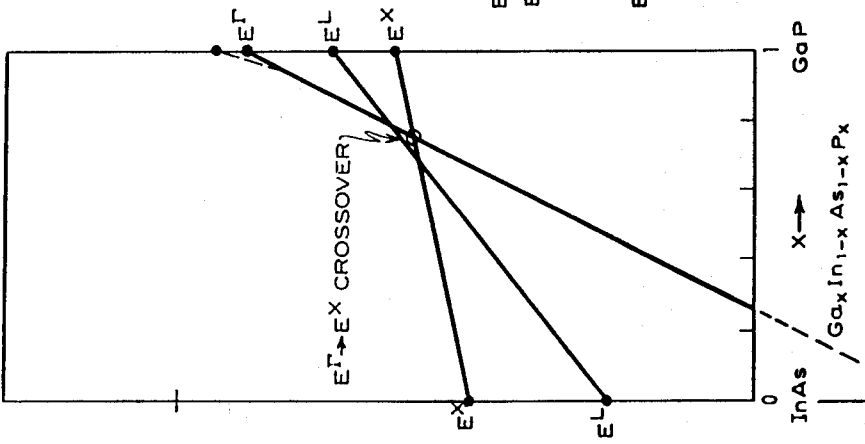
Figure 6:
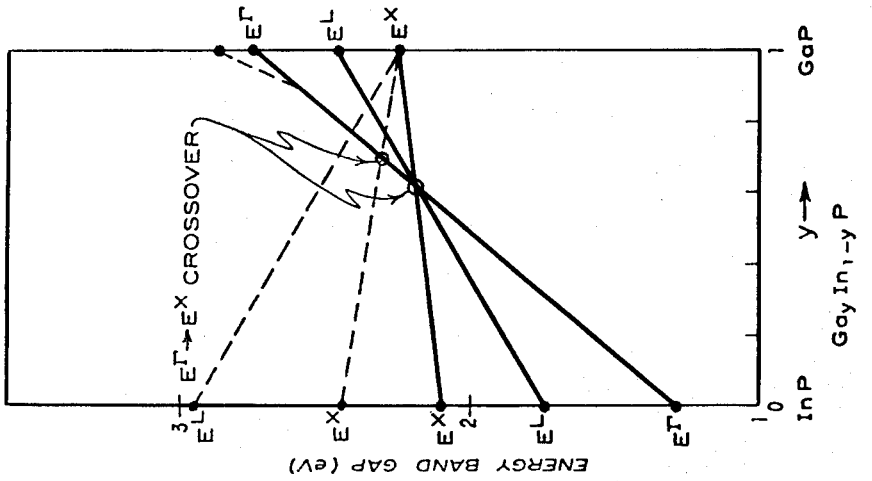

FIGS. 4, 5 and 6 are plots representing the energy band gap values of the direct conduction band minimum $E^\Gamma$ and the indirect conduction band minima $E^X$ and $E^L$ as a function of composition for the quaternary $Ga_yIn_{1-y}As_{1-x}P_x$ compound alloy system where y equals unity, where y equals x, and where x equals unity, respectively.

Figure 7:
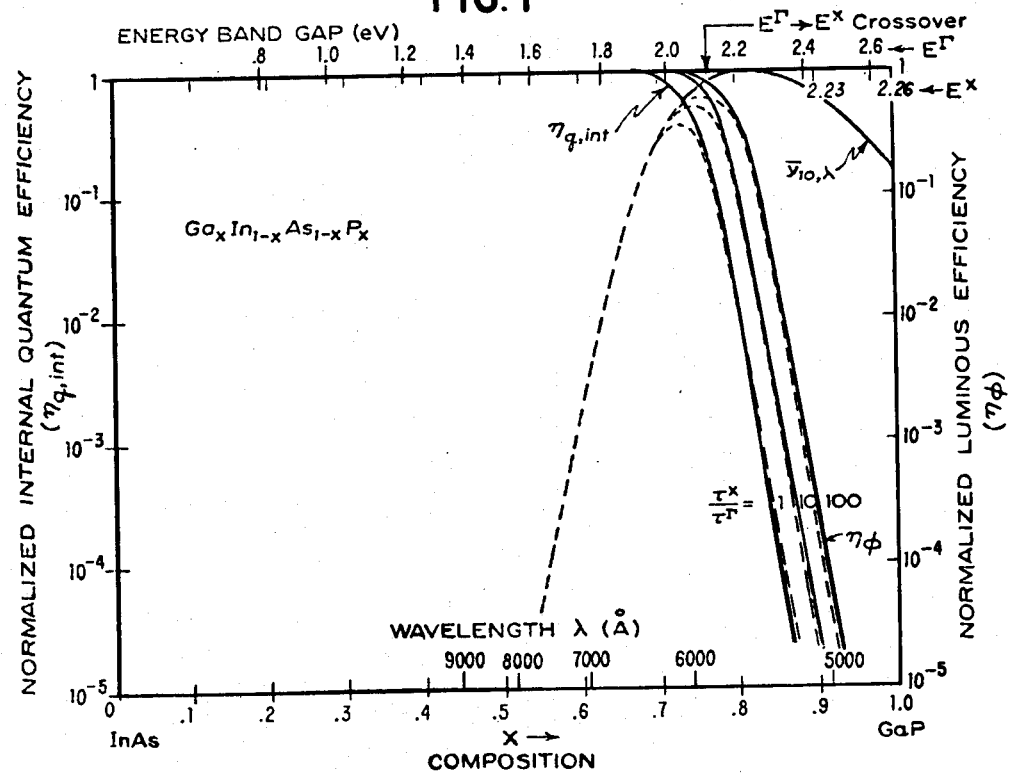
Figure 8:
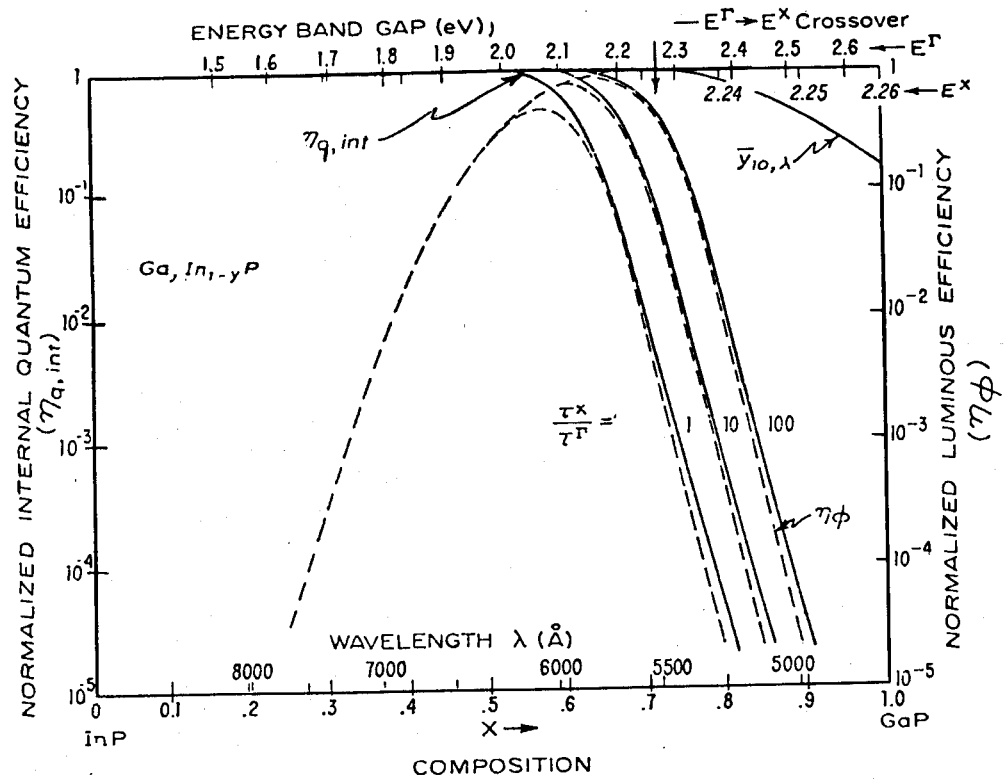

FIGS. 7 and 8 are plots representing the normalized internal quantum efficiency $\eta_{q,\,int}$ of the quaternary $Ga_yIn_{1-y}As_{1-x}P_x$ compound alloy system where x equals y and where x equals unity, respectively, the normalized photopic luminosity $\bar{y}_{10,\lambda}$, and their product $\eta_\phi$ (the normalized luminous efficiency) as functions of composition, energy band gap, and wavelength of emitted light for three values (1, 10 and 100) of the recombination lifetime ratio $\tau^X/\tau^\Gamma$.

FIG. 9 is another three dimensional representation of the quaternary $Ga_yIn_{1-y}As_{1-x}P_x$ compound alloy system showing some of the isolattice constant contours of the system and their relationship to the crossover surface of the system. The third dimension parameter p is again used to discriminate between quaternary compound alloys having identical chemical compositions but different ratios of the four possible types of bonds and, hence, different physical parameters such as $E^\Gamma$, $E^X$ and $E^L$.

Figure 10:
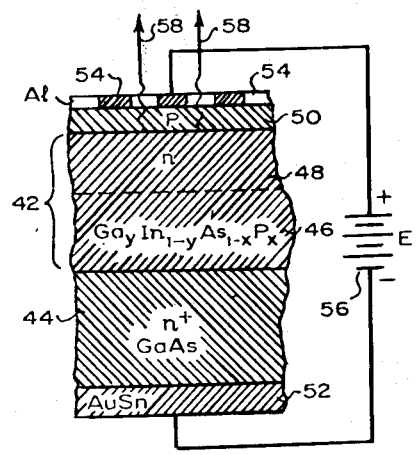

FIG. 10 is a sectional representation of an injection electroluminescent diode constructed from the quaternary $Ga_yIn_{1-y}As_{1-x}P_x$ compound alloy system of FIGS. 2-3 and 5-9.

DESCRIPTION OF THE PREFERRED EMBODIMENTS

Referring to FIG. 2, there is shown a tetrahedral representation of the quaternary $Ga_yIn_{1-y}As_{1-x}P_x$ compound alloy system. The energy band gaps between the direct and indirect conduction band minima and the valence band maximum for some regions of this quaternary compound alloy system are represented by the lightly shaded isogap contours ranging from 0.50 to 2.00 eV in value. From inspection of these isogap contours it may be seen that both the ternary $InAs_{1-x}P_x$ edge 14 (where y=0) and the ternary $Ga_yIn_{1-y}As$ edge 16 (where x=0) of the quaternary compound alloy system have lower direct energy band gaps than the ternary $GaAs_{1-x}P_x$ edge 18 (where y=1) considered above in connection with FIG. 1. The ternary $InAs_{1-x}P_x$ and $Ga_yIn_{1-y}As$ edges 14 and 16 are therefore less promising as useful near edge emission semiconductor materials of high luminous efficiency than the ternary $GaAs_{1-x}P_x$ edge 18. This also appears to be true of the ternary $Ga_yIn_{1-y}P$ edge 22 (where x=1) for those compositions having values of y below the value of the crossover point of the $GaAs_{1-x}P_x$ edge 22 (about x=0.45) since the value of y at which the 1.50 eV isogap contour intersects the $Ga_yIn_{1-y}P$ edge 22 is greater than the corresponding value of x at which it intersects the $GaAs_{1-x}P_x$ edge 18.

In FIG. 2 it may also be seen that the 2.00 eV isogap contour corresponding to a wavelength of about 6250 Å intersects the ternary $GaAs_{1-x}P_x$ edge 18 above the crossover surface 12, whereas it intersects other regions such as the quaternary $Ga_xIn_{1-x}As_{1-x}P_x$ edge 20 (where $x=y$) and the ternary $Ga_yIn_{1-y}P$ edge 22 below the crossover surface. This indicates that some significant regions of the quaternary $Ga_yIn_{1-y}As_{1-x}P_x$ compound alloy system have direct energy band gaps greater than those obtained thus far along the ternary $GaAs_{1-x}P_x$ edge 18.

From FIG. 3, it may be seen that most of the compound alloys in regions of the quaternary $Ga_yIn_{1-y}As_{1-x}P_x$ compound alloy system where x and y have values greater than 0.005 and less than 0.995 and where x equals unity and y has a value greater than 0.45 are direct compositions and that many of these compound alloys have direct energy band gaps comparable to or higher than those of the compound alloys along the conventional ternary $GaAs_{1-x}P_x$ edge 18. The compound alloys of greatest direct energy band gap and of potentially highest luminous efficiency lie within the shaded region 24 and include the quaternary $Ga_yIn_{1-y}As_{1-x}P_x$ compound alloys having values of x and y greater than 0.400 and less than 0.995 and the ternary $Ga_yIn_{1-y}P$ compound alloys having values of y from 0.45 to 0.80. Shaded region 24 is defined between the luminous efficiency limit line 26 and the direct energy band gap edge 28 corresponding to a wavelength of 6500 Å. Luminous efficiency limit line 26 approximately tracks the crossover ridge 30 and indicates the indirect compositions beyond which the efficient, radiative direct recombination mechanism can no longer successfully compete with the inefficient, nonradiative indirect recombination mechanism.

Some of the direct compound alloys in the shaded region 24, especially those between the quaternary $Ga_xIn_{1-x}As_{1-x}P_x$ and ternary $Ga_yIn_{1-y}P$ edges 20 and 22 inclusive, have direct energy band gaps ranging as high as from 2.1 to 2.3 eV and corresponding to wavelengths of from 6000 to 5500 Å. These direct energy band gaps are much larger than those of any direct compound alloy along the conventional ternary $GaAs_{1-x}P_x$ edge 18. They are even larger than the indirect energy band gaps of many of the indirect compound alloys near the crossover point of the $GaAs_{1-x}P_x$ edge 18. For example, by comparing FIGS. 4 and 5, where the loci of the energy band gaps for the conduction band minima $E^\Gamma$, $E^X$ and $E^L$ along the ternary $GaAs_{1-x}P_x$ and quaternary $Ga_xIn_{1-x}As_{1-x}P_x$ edges 18 and 20 are plotted as a function of increasing values of x, it may be seen that the energy band gap at the crossover point of the $Ga_xIn_{1-x}As_{1-x}P_x$ edge 20 (about 2.25 eV at $x\approx0.75$) is significantly higher than the energy band gap at the crossover point of the $GaAs_{1-x}P_x$ edge 18 (about 2.00 eV at $x\approx0.45$). By similarly comparing FIG. 4 with FIG. 6, where the loci of the energy band gaps for the conduction band minima $E^\Gamma$, $E^X$ and $E^L$ along the ternary $Ga_yIn_{1-y}P$ edge 22 are plotted as a function of increasing values of y, it may be seen that the energy band gap at the crossover point of the $Ga_yIn_{1-y}P$ edge 22 (about 2.25 eV at $y\approx0.6$ for the solid locus of $E^X$ or about 2.30 eV at $y\approx0.7$ for the dashed locus of $E^X$) is also significantly higher than the energy band gap at the crossover point of the $GaAs_{1-x}P_x$ edge 18. The solid loci representing the indirect conduction band minima $E^X$ and $E^L$ are based on the calculations of M. L. Cohen and T. K. Bergstresser reported in 141 Physical Review 789 (1966), whereas the dashed loci representing these indirect conduction band minima are based on the more recent calculations of F. Herman et al reported under the heading "Electronic Structure of Tetrahedrally-Bonded Semiconductors" in volume 8 of a book entitled *Methods in Computational Physics* and published in September, 1968.

By further comparing FIG. 4 with FIGS. 5 and 6, it may be seen that the slopes of the loci of the indirect conduction band minima $E^X$ along the quaternary $Ga_xIn_{1-x}As_{1-x}P_x$ and ternary $Ga_yIn_{1-y}P$ edges 20 and 22 are less positive at the crossover surface than the slope of the corresponding locus along the ternary $GaAs_{1-x}P_x$ edge 18. These slopes are about 0.20 eV/percent decrease in In and As along the $Ga_xIn_{1-x}As_{1-x}P_x$ edge 20 and about 0.13 or $-0.18$ eV/percent decrease in In along the $Ga_yIn_{1-y}P$ edge 22 (depending upon whether the Cohen-Bergstresser or the Herman et al calculations are used) as compared to about 0.39 eV/percent decrease in As along the $GaAs_{1-x}P_x$ edge 18. It may also be seen that the slopes of the loci of the direct conduction band minimum $E^\Gamma$ along the $Ga_xIn_{1-x}As_{1-x}P_x$ and $Ga_yIn_{1-y}P$ edges 20 and 22 are more positive at the crossover surface than the slope of the corresponding locus along the $GaAs_{1-x}P_x$ edge 18. These slopes are about 2 eV/percent decrease in In and As along the $Ga_xIn_{1-x}As_{1-x}P_x$ edge 20 and about 1.24 eV/percent decrease in In along the $Ga_yIn_{1-y}P$ edge 22 as compared to about 1 eV/percent decrease in As along the $GaAs_{1-x}P_x$ edge 18. The ratio of the slope of the locus of the direct conduction band minimum $E^\Gamma$ to the slope of the locus of the indirect conduction band minima $E^X$ is therefore about 10 at the crossover point of the $Ga_xIn_{1-x}As_{1-x}P_x$ edge 20 and about 9.5 or higher (depending upon whether the Cohen-Bergstresser or the Herman et al calculations are used) at the crossover point of the $Ga_yIn_{1-y}P$ edge 22 as compared to only about 2.56 at the crossover point of the $GaAs_{1-x}P_x$ edge 18. Accordingly, each of the quaternary $Ga_xIn_{1-x}As_{1-x}P_x$ and ternary $Ga_yIn_{1-y}P$ edges 20 and 22 has a significantly higher excess carrier density within its direct conduction band minimum $E^\Gamma$ for increasing values of the composition parameter x or y, respectively, near and up to the crossover surface than the conventional ternary $GaAs_{1-x}P_x$ edge 18 has within its direct conduction band minimum $E^\Gamma$ for corresponding values of the composition parameter x near and up to the crossover surface. This is especially pronounced in the case of the $Ga_yIn_{1-y}P$ edge 22 for the Herman et al calculations which place the indirect conduction band minimum $E^L$ completely out of the way of the other conduction bands near and at the crossover surface. Concomitantly, however, the excess carrier density within the direct conduction band minimum $E^\Gamma$ of each of the $Ga_xIn_{1-x}As_{1-x}P_x$ and $Ga_yIn_{1-y}P$ edges 20 and 22 decreases more drastically for increasing values of the composition parameter x or y, respectively, above the crossover surface than does the excess carrier density within the direct conduction band minimum $E^\Gamma$ of the $GaAs_{1-x}P_x$ edge 18 for corresponding values of the composition parameter x above the crossover surface.

The above comparisons of the quaternary $Ga_xIn_{1-x}As_{1-x}P_x$ and the ternary $Ga_yIn_{1-y}P$ edges 20 and 22 with the conventional ternary $GaAs_{1-x}P_x$ edge 18 have been made by representing the conduction band minima $E^X$, $E^L$ and $E^\Gamma$ of these edges as varying linearly with increasing values of the composition parameter x or y.

However, it has been found that the direct conduction band minimum $E^\Gamma$ of the $GaAs_{1-x}P_x$ edge 18 has a nonlinear dependence on composition at higher values of x, as generally indicated by the dashed deviation near the end of the locus of the direct conduction band minimum $E^\Gamma$ in FIG. 4. Thus, it is probable that the indirect conduction band minimum $E^\Gamma$ of each of the $Ga_xIn_{1-x}As_{1-x}P_x$ and $Ga_yIn_{1-y}P$ edges 20 and 22 may also have a nonlinear dependence on composition at higher values of the composition parameter x or y, respectively. This probability is also generally indicated by dashed deviations near the ends of the loci of the direct conduction band minimum $E^\Gamma$ in FIGS. 5 and 6. It is believed that such deviations are more likely to be consistent with higher, rather than lower, energy band gaps and $E^\Gamma$ carrier densities near or at the crossover points of the quaternary $Ga_xIn_{1-x}As_{1-x}P_x$ and ternary $Ga_yIn_{1-y}P$ edges 20 and 22.

In summary, each of the quaternary $Ga_xIn_{1-x}As_{1-x}P_x$ and ternary $Ga_yIn_{1-y}P$ edges 20 and 22 has both a higher energy band gap corresponding in value to a wavelength closer to the wavelength of maximum photopic luminosity to the human eye and a higher excess carrier density within its direct conduction band minimum $E^\Gamma$ near or at its crossover point than the $GaAs_{1-x}P_x$ edge 18 has near or at its crossover point. A much higher normalized luminous efficiency $\eta_\phi$ may therefore be expected from the quaternary $Ga_xIn_{1-x}As_{1-x}P_x$ and ternary $Ga_yIn_{1-y}P$ edges 20 and 22 near or at their crossover points for each of the recombination lifetime ratios 1, 10 and 100 than can be obtained from compositions of the conventional ternary $GaAs_{1-x}P_x$ edge 18 near or at its crossover point for the same recombination lifetime ratios.

Figure 1:
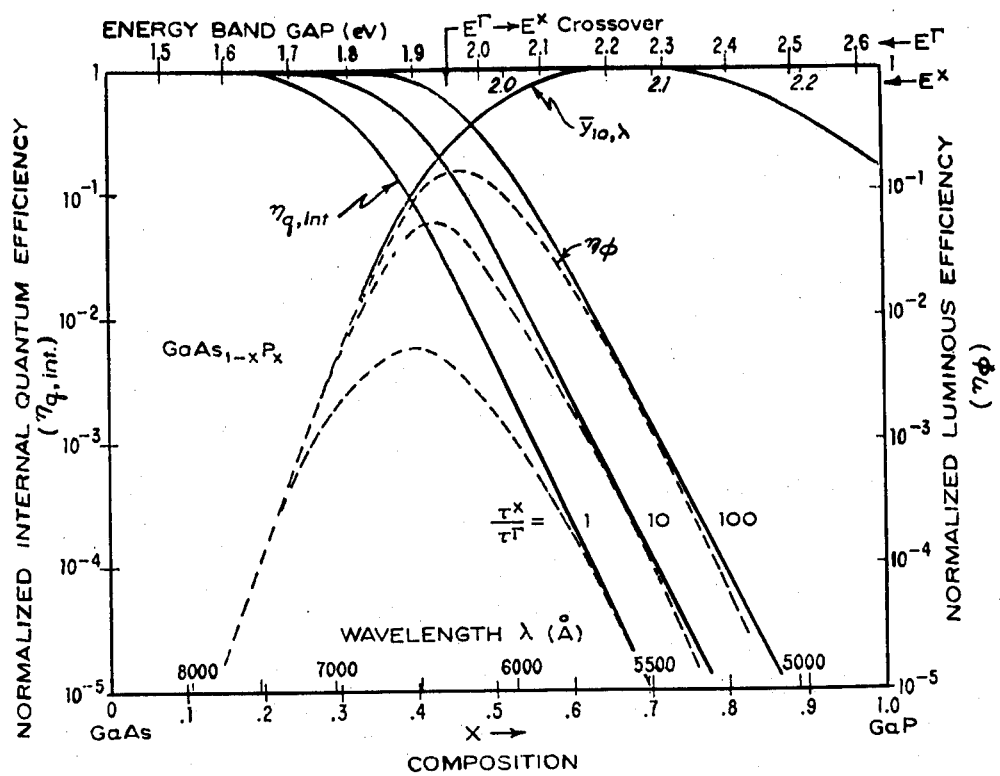
FIG. 1, as already indicated above, is a plot representing the normalized internal quantum efficiency $\eta_{q,\,int}$ of the ternary $GaAs_{1-x}P_x$ compound alloy system, the normalized photopic luminosity $\bar{y}_{10,\lambda}$, and their product $\eta_\phi$ (the normalized luminous efficiency) as functions of composition, energy band gap, and wavelength of emitted light for three values (1, 10 and 100) of the recombination lifetime ratio $\tau^X/\tau^\Gamma$. The relative internal quantum efficiency $\eta_{q,\,int}$ of the $GaAs_{1-x}P_x$ compound alloy system and every other compound alloy system hereinafter described is always normalized to $\eta_{q,\,int}$ of GaAs because GaAs has been shown to have an internal quantum efficiency of about 100 percent at the temperature of liquid nitrogen.

By comparing FIGS. 1 and 7 for the recombination lifetime ratios 1, 10 and 100, it may be seen that the normalized internal quantum efficiency $\eta_{q,\,int}$ of the quaternary $Ga_xIn_{1-x}As_{1-x}P_x$ edge 20 begins to decrease appreciably with increasing values of x at wavelengths (ranging from about 6250 to 6000 Å) much closer to the wavelength (about 5500 Å) of maximum photopic luminosity to the human eye than does the normalized internal quantum efficiency of the conventional ternary $GaAs_{1-x}P_x$ edge 18. Thus, for the same recombination lifetime ratios, normalized luminous efficiencies $\eta_\phi$ greater than 0.01 may be obtained from both direct and indirect compositions of the quaternary $Ga_xIn_{1-x}As_{1-x}P_x$ edge 20 over a broader spectral range (including wavelengths of about 7000 to 5300 Å) than the spectral range over which such luminous efficiencies may be obtained from the ternary $GaAs_{1-x}P_x$ edge 18. Moreover, much higher normalized luminous efficiencies (ranging as high as from about 0.5 to 0.75 at wavelengths as short as from about 6000 to 5800 Å as the recombination lifetime ratio increases from 1 to 100) may be obtained from the $Ga_xIn_{1-x}As_{1-x}P_x$ edge 20 for each recombination lifetime ratio 1, 10 and 100 than can be obtained from the $GaAs_{1-x}P_x$ edge 18 for any of these recombination lifetime ratios.

By similarly comparing FIGS. 1 and 8 for the recombination lifetime ratios 1, 10 and 100, it may be seen that the normalized internal quantum efficiency $\eta_{q,\,int}$ of the ternary $Ga_yIn_{1-y}P$ edge 22 also begins to decrease appreciably with increasing values of y at wavelengths (ranging from about 6200 to 5800 Å) much closer to the wavelength of maximum photopic luminosity to the human eye than does the normalized internal quantum efficiency of the conventional ternary $GaAs_{1-x}P_x$ edge 18. Accordingly, for the same recombination lifetime ratios, normalized luminous efficiencies $\eta_\phi$ greater than 0.01 may also be obtained from direct and some indirect compositions of the ternary $Ga_yIn_{1-y}P$ edge 22 over a broader spectral range (including wavelengths of about 7000 to 5200 Å) than the spectral range at which such luminous efficiencies may be obtained from the ternary $GaAs_{1-x}P_x$ edge 18. Similarly, much higher normalized luminous efficiencies $\eta_\phi$ (ranging as high as from about 0.65 to 0.9 at wavelengths as short as from about 6000 to 5700 Å as the recombination lifetime ratio increases from 1 to 100) may also be obtained from the $Ga_yIn_{1-y}P$ edge 22 for each recombination lifetime ratio 1, 10 and 100 than can be obtained from the $GaAs_{1-x}P_x$ edge 18 for any of these recombination lifetime ratios.

On the basis of the broad spectral ranges of high normalized luminous efficiency $\eta_\phi$ obtained from the quaternary $Ga_xIn_{1-x}As_{1-x}P_x$ and ternary $Ga_yIn_{1-y}P$ edges 20 and 22, it must be concluded that similarly high performance may also be obtained from many of the other compound alloys in the shaded region 24 of the quaternary $Ga_yIn_{1-y}As_{1-x}P_x$ compound alloy system shown in FIG. 3. This is especially true of those direct and indirect quaternary compound alloys near or at the crossover ridge 30 that have energy band gaps corresponding to wavelengths of about 6000 Å or shorter. Electroluminescent semiconductor materials and devices capable of emitting yellow and green light at a luminous efficiency as high as from 0.1 to 0.95 lumens per ampere may be fabricated from many of these compound alloys. This represents a significant improvement in luminous efficiency over the highest performance currently obtainable or likely to be obtained in the near future from electroluminescent semiconductor materials and devices of similar geometry fabricated from the conventional ternary $GaAs_{1-x}P_x$ compound alloy system.

Referring now to FIG. 9, there is shown another tetrahedral representation of the quaternary $Ga_yIn_{1-y}As_{1-x}P_x$ compound alloy system in which the lattice constants for some regions of the system are represented by the similarly shaded isolattice constant contours ranging from 5.5 to 6.0 in value. The heavily shaded isolattice constant contour (5.685) is most closely matched to the lattice constant (5.654) of GaAs, a material commonly used as a substrate in the fabrication of electroluminescent semiconductor materials and devices. The heavily shaded isolattice constant contour (5.685) is also much closer to the differently shaded crossover surface 12 along quaternary regions such as the $Ga_xIn_{1-x}As_{1-x}P_x$ edge 20 and (though less so) along the ternary $Ga_yIn_{1-y}P$ edge 22 than it is along the conventional ternary $GaAs_{1-x}P_x$ edge 18. Thus, with reference to a GaAs substrate, each of the quaternary $Ga_xIn_{1-x}As_{1-x}P_x$ and ternary $Ga_yIn_{1-y}P$ edges 20 and 22 has a substantially smaller lattice constant mismatch near or at its crossover point than has the ternary $GaAs_{1-x}P_x$ edge 18. This mismatch is only about 0.64 percent at the crossover point of the $Ga_yIn_{1-y}P$ edge 22 and much lower still at the crossover point of the $Ga_xIn_{1-x}As_{1-x}P_x$ edge 20 compared to about 1.62 percent at the crossover point of the $GaAs_{1-x}P_x$ edge 18. Even with reference to other possible substrate materials, such as the $InAs_{1-x}P_x$ and $Ga_yIn_{1-y}As$ compound alloys 14 and 16, respectively, it may be seen that each of the $Ga_xIn_{1-x}As_{1-x}P_x$ and $Ga_yIn_{1-y}P$ edges 20 and 22 has a smaller lattice constant mismatch near or at its crossover point than has the $GaAs_{1-x}P_x$ edge 18.

From inspection of FIG. 9, it may be seen that selected quaternary $Ga_yIn_{1-y}As_{1-x}P_x$ compound alloys may be grown on $GaAs_{1-x}P_x$ substrates of appropriate composition substantially without any lattice constant mismatch. For example, a potentially high luminous efficiency quaternary $Ga_yIn_{1-y}As_{1-x}P_x$ compound alloy 32 having values of x and y equal to those at the intersection of the isolattice constant contour 34 and the crossover surface 12 may be epitaxially grown on a $GaAs_{1-x}P_x$ substrate 36 having a value of x equal to that at the intersection of the same isolattice constant contour and the $GaAs_{1-x}P_x$ edge 18 substantially without any lattice constant mismatch. This is accomplished by the step of following the isolattice contour 34 from the selected substrate 36 to the selected quaternary $Ga_yIn_{1-y}As_{1-x}P_x$ compound alloy 32 during the epitaxial growth of that compound alloy on the substrate. This method may be similarly employed in epitaxially growing other compound alloys of the quaternary $Ga_yIn_{1-y}As_{1-x}P_x$ compound alloy system on GaAs or other substrates with the smallest possible lattice constant mismatch. As a further example, a potentially high luminous efficiency quaternary $Ga_xIn_{1-x}As_{1-x}P_x$ compound alloy 38 having a value of x equal to that at the intersection of the crossover surface 12 and the $Ga_xIn_{1-x}As_{1-x}P_x$ edge 20 may be epitaxially grown on a GaAs substrate with a minimum lattice constant mismatch by substantially following the heavily shaded isolattice constant contour (5.685) as indicated by the dashed line 40.

Thus, with the aid of FIG. 9 it may be seen that layers of the quaternary $Ga_yIn_{1-y}As_{1-x}P_x$ and ternary $Ga_yIn_{1-y}P$ compound alloys near or at the crossover surface 12 may be epitaxially grown on GaAs and other such substrate materials with a substantially smaller lattice constant mismatch than may currently be achieved by epitaxially growing layers of the ternary $GaAs_{1-x}P_x$ compound alloys near or at the crossover surface on the same substrate materials. This reduction in the lattice constant mismatch between the substrate and the layer epitaxially grown thereon reduces the probability that dislocations produced at the interface between the substrate and the epitaxial layer will migrate into the epitaxial layer and degrade its injection and luminous efficiency.

Due to the factors set forth above improved transistors, Schottky-barrier diodes, microwave bulk oscillators, optical modulators and detectors, electroluminescent light sources, and other such devices may be fabricated from many compositions of the quaternary $Ga_yIn_{1-y}As_{1-x}P_x$ compound alloy system having values of x and y greater than 0.005 and less than 0.995 or having a value of x equal to 1.0 and values of y in the range from 0.45 to 0.80. The quaternary $Ga_yIn_{1-y}As_{1-x}P_x$ and ternary $Ga_yIn_{1-y}P$ compound alloys within the shaded region of FIG. 3 and near or at the crossover ridge 30 are particularly useful for fabricating electroluminescent materials and devices because of their broad spectral range of high normalized luminous efficiency $\eta_\phi$ and their reduced lattice constant mismatch with GaAs and other such substrate materials. For example, an injection electroluminescent diode such as that shown in FIG. 10 may be constructed by epitaxially growing an n-type layer 42 of the quaternary $Ga_yIn_{1-y}As_{1-x}P_x$ compound alloy system on an $n^+$-type substrate 44 of GaAs. This is done by substantially following an isolattice constant contour of the quaternary $Ga_yIn_{1-y}As_{1-x}P_x$ compound alloy system to a selected quaternary $Ga_yIn_{1-y}As_{1-x}P_x$ or ternary $Ga_yIn_{1-y}P$ composition within the shaded region of FIG. 3 so that an n-type region 46 of graded composition is formed upon the substrate 44 and so that an n-type region 48 uniformly of the selected composition is formed upon the region 46 of graded composition.

Conventional open tube vapor transport techniques may be used for epitaxially growing the layer 42 on substrate 44. With these techniques it is possible to vary the concentration of each component of the quaternary $Ga_yIn_{1-y}As_{1-x}P_x$ compound alloy system by externally adjustable parameters and to precisely control the compositional profile of the graded region 46 and the final composition of the uniform region 48. Layer 42 may also be epitaxially grown on substrate 44 by employing the improved vaporphase method and reactor described in copending patent application Ser. No. 775,396, entitled Improved Method and Means for Producing Semiconductor Material, filed on Nov. 13, 1968, by Robert A. Burmeister, Jr., and assigned to the same assignee as this patent application. This is done by employing a gallium (Ga) source and an indium (In) source contained within separate boats in separate source chambers heated to a temperature in the range from about 750°–1000° C. Separate metering valves and flow meters are employed for injecting controllable streams of a transport agent such as hydrogen chloride (HCl) downwardly into these source chambers and over the gallium and indium sources. The reaction products thereby formed flow downwardly into a mixing chamber heated to a temperature in the range from about 750°–950° C. Separate metering valves and flow meters are also employed for injecting controllable streams of arsenic (As) and phosphorus (P) sources such as arsine ($AsH_3$) and phosphine ($PH_3$), respectively, and an n-type dopant such as hydrogen selenide ($H_2Se$) downwardly through a single conduit bypassing the source chambers to the mixing chamber. The reaction products from the source chambers are combined in the mixing chamber with the source and dopant gases from this conduit. This mixture of gases then flows downwardly into a growing chamber heated to a temperature in the range from about 700°–900° C. and over the gallium arsenide (GaAs) substrate 44 thereby growing n-type layer 42 on substrate 44 at the rate of about 1–50 $\mu m$/hour. The metering valves and flow meters are adjusted for controlling the flow rates and times of each of the transport, source, and n-type dopant gases to grow the selected graded and uniform regions of layer 42. Thus, for example, an n-type graded region 46 about 25 $\mu m$ in thickness with a compositional profile substantially like that indicated by the dashed line 40 in FIG. 9 is grown on a GaAs substrate 44 about 125–500 $\mu m$ in thickness. Similarly, an n-type region 48 about 2–50 $\mu m$ in thickness with a uniform quaternary composition such as that indicated at 38 in FIG. 9 is grown on the graded region 46.

A p-type layer 50 uniformly of the same quaternary composition as the uniform n-type region 48 is formed upon n-type region 48. This p-type layer 50 may be epitaxially grown by employing conventional open tube vapor transport techniques or by employing the improved vapor-phase method and reactor described above in connection with layer 42. In the latter case controllable streams of the same transport and source gases are injected into the source and mixing chambers of the reactor by means of the same metering valves, flow meters and conduit. However, a separate metering valve and flow meter are employed for injecting a controllable stream of a p-type dopant such as diethyl zinc [$(C_2H_5)_2Zn$] through the conduit and into the mixing chamber in place of the n-type dopant hydrogen selenide ($H_2Se$). The metering valves and flow meters of the reactor are adjusted for controlling the flow rates and times of the transport, source and p-type dopant gases so that a uniform p-type layer 50 about 0.5–10 μm in thickness with the same quaternary composition as the uniform n-type region 48 is epitaxially grown on n-type region 48. Alternatively, p-type layer 50 may also be formed in n-type region 48 by employing conventional diffusion techniques to diffuse any of the elements from group II of the periodic table, such as zinc or cadmium, into n-type region 48. However, in this case the n-type region 48 must first be grown to a thickness substantially equal to the desired combined thickness of n-type region 48 and p-type layer 50 to allow for the diffusion of p-type layer 50 into n-type region 48. In any case, making the p-type layer 50 thinner than the n-type region 48 (about 0.5–10 μm compared to about 25 μm) tends to compensate for the significantly higher self absorption of near edge photons in p-type III–V semiconductor materials of direct energy band gap topology than in n-type III–V semiconductor materials of the same topology.

A gold-tin alloy (AuSn) cathode electrode 52 about 0.2–1 μm in thickness is formed on the lower surface of the n+-type GaAs substrate 44, and a comb-like aluminum anode electrode 54 about 0.2–1 μm in thickness is formed on the upper surface of the p-type layer 50. Low ohmic non-rectifying cathode and anode electrodes 52 and 54 may be formed by conventional metal deposition and etching techniques. A source 56 of bias voltage E is connected between the cathode and anode electrodes 52 and 54 to forward bias the p-n junction formed between the p-type layer 50 and the n-type region 48. The forward biased p-n junction emits light between the teeth of the comb-like anode electrode 54 as generally indicated at 58. Since the p-n junction is formed in a quaternary composition of the $Ga_yIn_{1-y}As_{1-x}P_x$ compound alloy system near the crossover surface 12, such as indicated at 38 in FIG. 9, this light may be emitted in the yellow or green portion of the visible spectrum at a luminous efficiency as high as from 0.1 to 0.95 lumens per ampere.

The above-described injection electroluminescent diode may be formed, for example, in a mesa configuration to serve, for example, as a single light source or as one of an array of injection electroluminescent diodes in a solid state display. Although for purposes of illustration the fabrication of an injection electroluminescent diode from a quaternary $Ga_yIn_{1-y}As_{1-x}P_x$ compound alloy near the crossover surface 12 has been described, many other useful semiconductor materials and devices may also be fabricated from compositions of the quaternary $Ga_yIn_{1-y}As_{1-x}P_x$ compound alloy system where x and y have values greater than 0.005 and less than 0.995 or where x has a value equal to 1.0 and y has a value from 0.45 to 0.80.

We claim:

1. A method of producing a semiconductor material, said method being characterized by the step of:

epitaxially growing a semiconductor compound alloy having at least three components on a substrate by initially growing a composition of said semiconductor alloy having a lattice constant substantially equal to the lattice constant of the substrate, and subsequently varying the relative proportions of said at least three components to substantially follow an isolattice compositional locus of the semiconductor compound alloy to a desired final composition.

2. A method as in claim 1 wherein the growing step comprises epitaxially growing a layer of the $Ga_yIn_{1-y}As_{1-x}P_x$ compound alloy system in which both x and y may have any value from zero through unity on a substrate of GaAs by substantially following an isolattice compositional locus of the $Ga_yIn_{1-y}As_{1-x}P_x$ compound alloy system.

3. A method as in claim 2 wherein the lattice constant of said layer has substantially the same value as the lattice constant of the GaAs substrate on which said layer is grown.

4. A method as in claim 3 wherein the growing step comprises the substep of epitaxially growing upon the GaAs substrate a region of said layer with a graded composition, and the substep of epitaxially growing upon said region of graded composition another region of said layer with a substantially uniform composition.

5. A method as in claim 1 wherein the growing step comprises epitaxially growing a layer of a III–V semiconductor compound alloy on the substrate by following an isolattice compositional locus of the III–V semiconductor compound alloy.

6. A method as in claim 1 wherein the growing step comprises epitaxially growing a luminescent semiconductor compound alloy on the substrate by following an isolattice compositional locus of the luminescent semiconductor compound alloy.

7. A method as in claim 6 wherein the luminescent semiconductor compound alloy comprises an electroluminescent III–V semiconductor compound alloy.

* * * * *

UNITED STATES PATENT AND TRADEMARK OFFICE
CERTIFICATE OF CORRECTION

PATENT NO. : 4,284,467
DATED : August 18, 1981
INVENTOR(S) : Egon E. Loebner, Paul E. Greene It is certified that error appears in the above-identified patent and that said Letters Patent are hereby corrected as shown below:

Column 3, line 56, at end of line, $E_L$ should be changed to read $E^L$

Column 5, line 30 at beginning of line, 6500A should be changed to read 6500Å

Signed and Sealed this

Twenty-sixth Day of October 1982

[SEAL]

Attest:

Attesting Officer

GERALD J. MOSSINGHOFF

Commissioner of Patents and Trademarks